United States Patent
Kim et al.

(10) Patent No.: US 8,045,393 B2
(45) Date of Patent: Oct. 25, 2011

(54) PROGRAM METHOD OF NONVOLATILE MEMORY DEVICE

(75) Inventors: Byung Ryul Kim, Seoul (KR); Jun Seop Chung, Gyeonggi-do (KR); Duck Ju Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 415 days.

(21) Appl. No.: 12/347,583

(22) Filed: Dec. 31, 2008

(65) Prior Publication Data

US 2009/0180329 A1   Jul. 16, 2009

(30) Foreign Application Priority Data

Jan. 10, 2008   (KR) .................. 10-2008-0003177

(51) Int. Cl.
*G11C 11/34* (2006.01)
*G11C 16/06* (2006.01)

(52) U.S. Cl. .............. 365/185.22; 375/189.05; 375/195; 711/103

(58) Field of Classification Search ............ 365/185.22, 365/185.28, 189.2, 189.05, 195, 196; 711/103
See application file for complete search history.

(56) References Cited

U.S. PATENT DOCUMENTS

| | | | | |
|---|---|---|---|---|
| 6,081,870 A * | 6/2000 | Roohparvar | ................. | 711/103 |
| 6,834,323 B2 * | 12/2004 | Dover et al. | ................. | 711/103 |
| 7,061,802 B2 * | 6/2006 | Nakai | ................. | 365/185.13 |
| 7,143,229 B2 * | 11/2006 | Kamimura | ................. | 711/103 |

FOREIGN PATENT DOCUMENTS

| | | |
|---|---|---|
| KR | 1020050079534 A | 8/2005 |
| KR | 1020050112991 A | 12/2005 |
| KR | 1020070000009 A | 1/2007 |

OTHER PUBLICATIONS

Notice of Allowance Issued from Korean Intellectual Property Office on Jan. 28, 2010.

* cited by examiner

*Primary Examiner* — Tuan Nguyen
*Assistant Examiner* — R Lance Reidlinger
(74) *Attorney, Agent, or Firm* — IP & T Group LLP

(57) ABSTRACT

According to an aspect of a program method of a nonvolatile memory device, a first program operation for programming a first data stored in a first latch may be performed and a cache program signal may be input for inputting a second data to be programmed subsequently. When the cache program signal is input, a determination is made as to whether a first program verify operation is being performed, and if so, the verify operation is stopped, the second data is input, and the first program verify operation is restarted.

12 Claims, 3 Drawing Sheets

PROGRAM METHOD OF NONVOLATILE MEMORY DEVICE

CROSS-REFERENCES TO RELATED APPLICATION

The present application claims priority to Korean patent application number 10-2008-0003177, filed on Jan. 10, 2008, which is incorporated by reference in its entirety.

BACKGROUND OF THE INVENTION

The present invention relates to an operation of a nonvolatile memory device and, more particularly, to a program method of a nonvolatile memory device, which can prevent collision between a cache program and an intelligent verify method.

Flash memory, i.e., nonvolatile memory is generally classified into NAND flash memory and NOR flash memory. NOR flash memory has a structure in which respective memory cells are connected to bit lines and word lines independently and therefore has an excellent random access time characteristic, whereas NAND flash memory has a structure in which a plurality of memory cells is connected in series and only one contact is required on a per cell-string basis and is therefore excellent in the degree of integration. Thus, the NAND structure is usually used in high-integrated flash memory.

A well-known NAND flash memory device includes a memory cell array, a row decoder, and a page buffer. The memory cell array is comprised of a plurality of word lines extending in rows, a plurality of bit lines extending in columns, and a plurality of cell strings, each corresponding to the bit lines.

A flash memory device employs a cache program scheme in order to increase the program speed. The cache program scheme is a method of receiving data to be programmed next time while a program is being performed, storing the received data in a latch of a page buffer, which is not used, and continuously programming the stored data after the program is completed.

If the cache program is performed, the data input speed can be increased since data to be programmed next time is received while a program is being performed. Further, the address input time can also be saved since a block address input when a program command is first issued is used without change and only column address information for a next program is input.

Cache data for the cache program is input to a cache latch of a page buffer. At this time, if cache data is already used before being input, data can be overlapped, resulting in operational error.

That is, if cache data is input to a cache latch while an operation such as an intelligent verify operation is being executed, data stored in the cache latch can be overlapped.

The intelligent verify operation is one of methods for programming data into a flash memory device and verifying the data. According to this method, if the entire bits are not passed and a preset number of fails occurs, a corresponding program is determined as program pass. In the intelligent verify method, fail bits can be modified through error correction, etc.

In general, when the intelligent verify method is performed, data of a main latch is transferred to a cache latch and a verify operation using the cache latch is performed.

Accordingly, while the intelligent verify method is being performed, data of the main latch is stored in the cache latch.

At this time, if cache data for a cache program is input, the cache data can be input to the cache latch overlappingly with the stored data.

BRIEF SUMMARY OF THE INVENTION

The present invention is directed towards a program method of a nonvolatile memory device, which can solve problems when an intelligent verify method and a cache program of the nonvolatile memory device are performed at the same time.

A program method of a nonvolatile memory device according to an aspect of the present invention includes performing a first program operation for programming a first data stored in a first latch, while performing a first program operation, inputting a cache program signal for inputting a second data to be programmed subsequently; when the cache program signal is input, determining whether a first program verify operation is being performed; if it is determined that the first program verify operation is being performed, stopping the first program verify operation and inputting the second data; and after the inputting the second data, restarting the first program verify operation.

The input of the second data includes storing the second data in a second latch, and transferring the second data stored in the second latch to a third latch and resetting the second latch.

The first program verify operation is performed through the second latch after the data stored in the first latch is transferred to the second latch.

The program method further includes resetting the second latch after the verify operation is stopped.

In the case in which the verify operation is not performed when the cache program signal is input, the second data is stored in the second latch, the data stored in the second latch is transferred to the third latch, and the second latch is reset.

In the case in which the first program verify operation is not performed after the second latch is reset, the first program verify operation is performed.

The program method further includes, after the first program verify operation is completed, transferring the data of the third latch to the second latch; and transferring the data of the second latch to the first latch and performing a second program operation.

The second data is stored in the second latch, the data stored in the second latch is transferred to the third latch and, thereafter, the first program verify operation does not start until the second latch is reset.

Stopping the first program verify operation includes resetting an address counter for the first program verify operation and stopping column scan.

A program method of a nonvolatile memory device according to another aspect of the present invention includes performing a first verify program operation for programming a first data stored in a first latch, and while the first program verify operation is performed, inputting a cache program signal for inputting a second data to be programmed subsequently. Then, according to the cache program signal, the first program verify operation is stopped, the second data is stored in a second latch, the second data stored in the second latch is transferred to a third latch; the second latch is reset, and the first program verify operation is restarted.

Stopping the first program verify operation includes resetting an address counter for the first program verify operation and stopping column scan.

DESCRIPTION OF SPECIFIC EMBODIMENT

Hereinafter, the present invention will be described in detail in connection with a specific embodiment with reference to the accompanying drawings. The present embodiment is provided to complete the disclosure of the present invention and to allow those having ordinary skill in the art to understand the scope of the present invention.

Figure 1A:
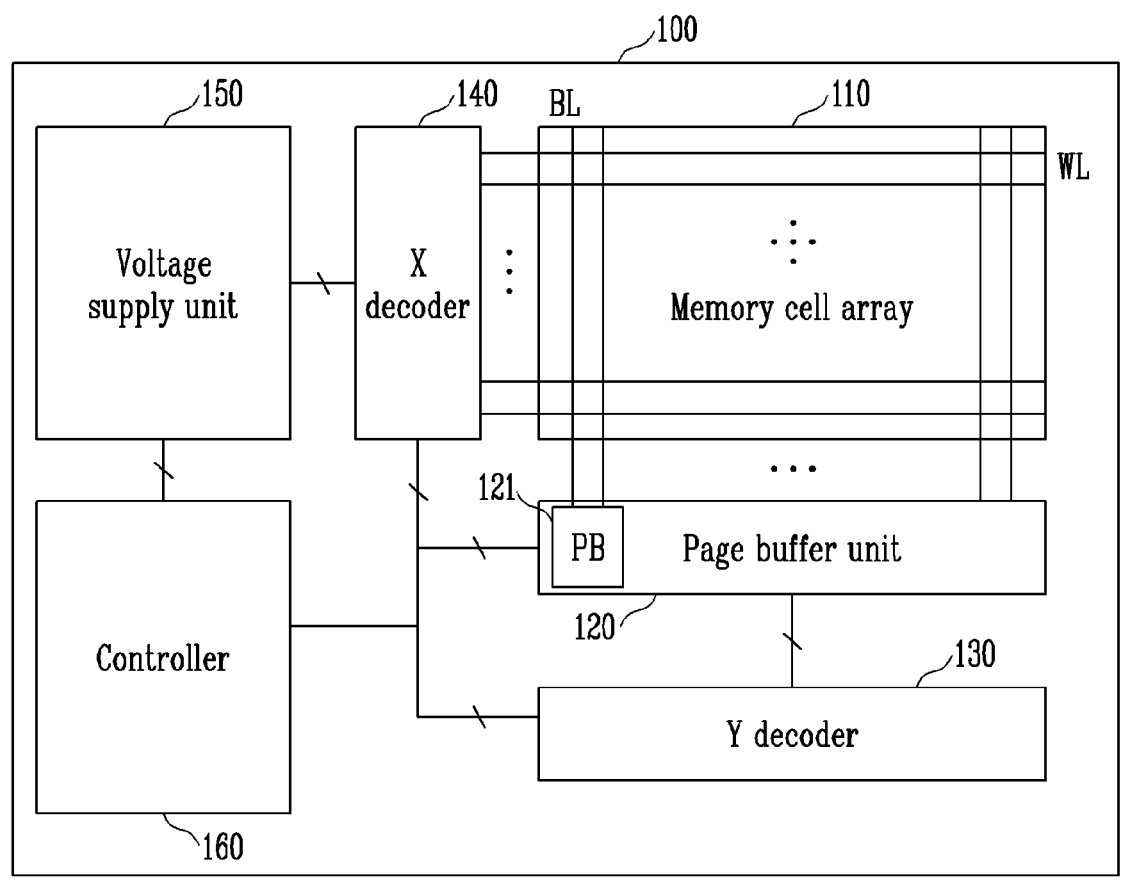
FIG. 1A is a block diagram showing a flash memory device.

FIG. 1A is a block diagram showing a flash memory device.

Referring to FIG. 1A, a flash memory device 100 includes a memory cell array 110, a page buffer unit 120, a Y decoder 130, an X decoder 140, a voltage supply unit 150, and a controller 160.

The memory cell array 110 includes a plurality of cell strings in each of which memory cells for storing data are connected in series. Each of the cell strings is coupled to a bit line BL. A gate of the memory cell is coupled to a word line WL in a direction orthogonal to the bit line.

The page buffer unit 120 includes a plurality of page buffers (PBs) 121 coupled to the bit lines of the memory cell array 110. Each page buffer 121 temporarily stores data to be programmed into a selected memory cell and transfers the data to the memory cell through the bit line or reads and stores data stored in a memory cell.

The page buffer includes a number of latch circuits. While a program is being performed using one latch circuit, data on which a cache program will be performed can be stored in the other latch circuit.

The Y decoder 130 offers an I/O path to the page buffers 121 of the page buffer unit 120 according to an input address, and the X decoder 140 selects a word line of the memory cell array 110 according to an input address.

The voltage supply unit 150 generates an operating voltage, which will be supplied to a word line connected by the X decoder 140, under the control of the controller 160. The controller 160 outputs a control signal according to an operation command and controls the voltage supply unit 150 such that a preset pass voltage can be supplied according to a degree in which data is programmed into the memory cell array 110.

Figure 1B:
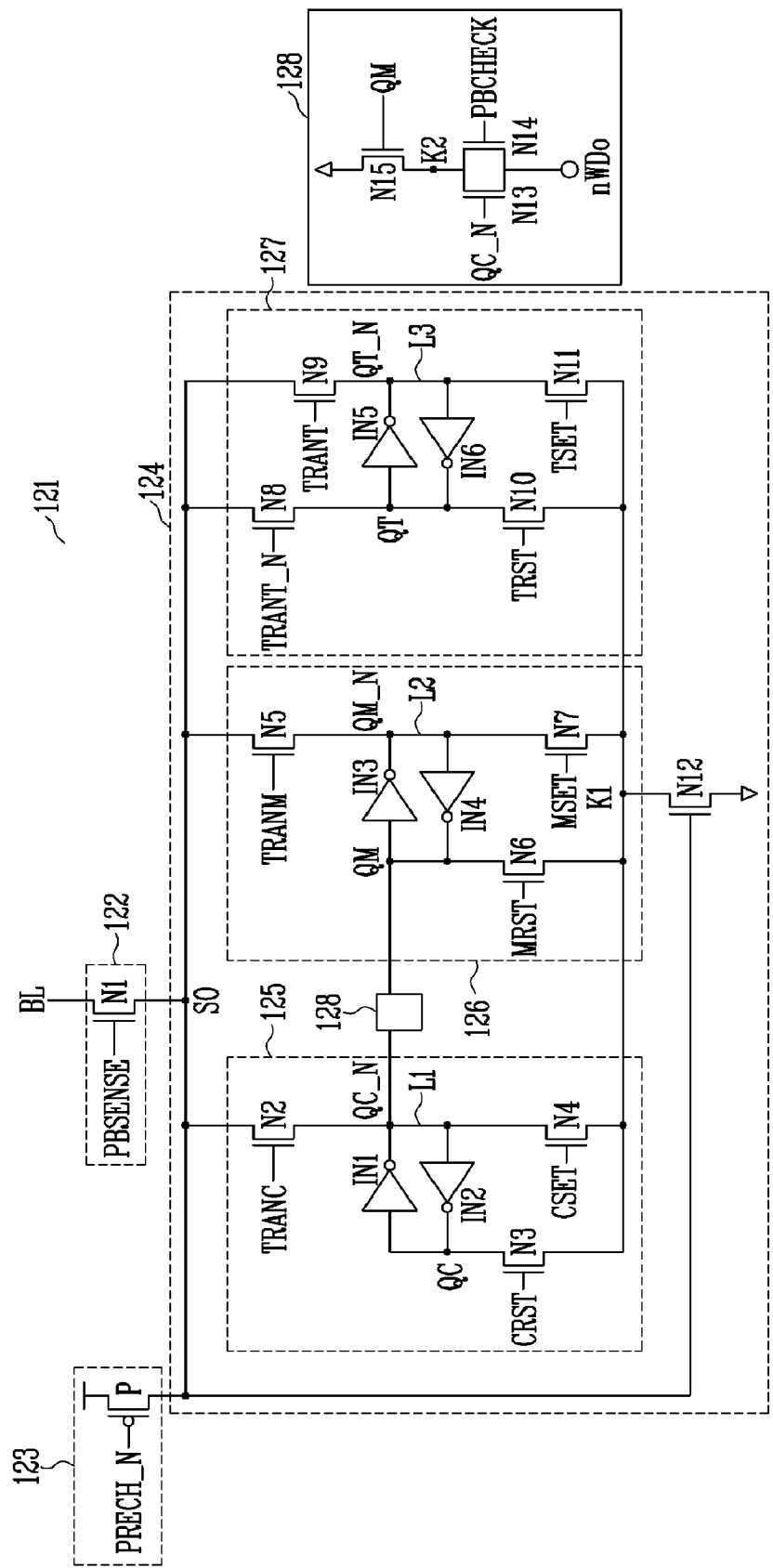
FIG. 1B is a detailed circuit diagram of a page buffer.

FIG. 1B is a detailed circuit diagram of the page buffer.

Referring to FIG. 1B, the page buffer 121 includes a sensing unit 122, a precharge unit 123, a latch unit 124, and a verify unit 128.

The sensing unit 122 senses voltage of a bit line connected thereto according to an input address when reading data. The sensing result of the sensing unit 122 is reflected in a sensing node SO.

The precharge unit 123 precharges the sensing node SO. The latch unit 124 stores data, which is stored in a memory cell, in a latch circuit according to a voltage level of the sensing node SO and stores to-be-programmed data in a latch circuit and then transfers the stored data to the sensing node SO, when the plurality of latch circuits is connected to the sensing node SO.

The latch unit 124 includes first to third latch circuit units 125 to 127. The first latch circuit unit 125 temporarily stores data for a cache program or is used to perform an Intelligent Verify operation (hereinafter referred to as an "IV operation"). Further, the second latch circuit unit 126 functions as a main latch for a program, and the third latch circuit unit 127 performs a temporary latch operation.

The verify unit 128 is connected between the first and second latch circuit units 125, 126 and outputs a verify signal for program verification.

The sensing unit 122 includes a first NMOS transistor N1, and the precharge unit 123 includes a PMOS transistor P.

The first latch circuit unit 125 includes second to fourth NMOS transistors N2 to N4 and first and second inverters IN1, IN2. Further, the second latch circuit unit 126 includes fifth to seventh NMOS transistors N5 to N7 and third and fourth inverters IN3, IN4.

The third latch circuit unit 127 includes eighth to eleventh NMOS transistors N8 to N11 and fifth and sixth inverters IN5, IN6. The verify unit 128 includes thirteenth to fifteenth NMOS transistors N13 to N15. The latch unit 124 further includes a twelfth NMOS transistor N12.

The first NMOS transistor N1 is connected between a bit line BL and the sensing node SO, and a sensing control signal PBSENSE is input to the gate of the first NMOS transistor N1. The first NMOS transistor N1 is turned on or off in response to voltage of a bit line connected thereto and a voltage level of the sensing control signal PBSENSE. As the first NMOS transistor N1 is turned on or off, the voltage level of the sensing node SO varies, so data stored in the latch unit 124 is changed.

The PMOS transistor P is connected between a power source voltage and the sensing node SO, and a precharge control signal PRECH_N is input to the gate of the PMOS transistor P.

The second NMOS transistor N2 is connected between the sensing node SO and a node QC_N, and a first data transfer signal TRANC is input to the gate of the second NMOS transistor N2.

The first and second inverters IN1, IN2 are connected between a node QC and the node QC_N in a latch circuit fashion, thus constituting a first latch L1.

The third NMOS transistor N3 is connected between the node QC and a node K1, and the fourth NMOS transistor N4 is connected between the node QC_N and the node K1. Further, a first reset signal CRST and a first set signal CSET are input to the gates of the third and fourth NMOS transistors N3, N4, respectively.

The fifth NMOS transistor N5 is connected between the sensing node SO and a node QM_N and has the gate to which a second data transfer signal TRANM is input. Further, the third and fourth inverters IN3, IN4 are connected between a node QM and the node QM_N in a latch circuit fashion, thus constituting a second latch L2.

The sixth NMOS transistor N6 is connected between the node QM and the node K1, and the seventh NMOS transistor N7 is connected between the node QM_N and the node K1. A second reset signal MRST and the second set signal MSET are input to the sixth and seventh NMOS transistors N6, N7, respectively.

The eighth NMOS transistor N8 is connected between the sensing node SO and a node QT, and the ninth NMOS transistor N9 is connected between the sensing node SO and a node QT_N.

A third data transfer inversion signal TRANT_N and a third data transfer signal TRANT are input to the gates of the eighth and ninth NMOS transistors N8, N9, respectively.

The fifth and sixth inverters IN5, IN6 are connected between the node QT and the node QT_N in a latch circuit fashion, thus constituting a third latch L3.

The tenth NMOS transistor N10 is connected between the node QT and the node K1, and the eleventh NMOS transistor N11 is connected between the node QT_N and the node K1. A third reset signal TRST and a third set signal TSET are input to the gates of the tenth and eleventh NMOS transistors N10, N11, respectively.

The twelfth NMOS transistor N12 is connected between the node K1 and a ground node and has a gate connected to the sensing node SO.

The thirteenth and fourteenth NMOS transistors N13, N14 are connected between a node K2 and a verify signal output node nWDo. A node QC_N is connected to the gate of the thirteenth NMOS transistor N13, and a page buffer check signal PBCHECK is connected to the gate of the fourteenth NMOS transistor N14.

Further, the fifteenth NMOS transistor N15 is connected between a ground node and the node K2 and has a gate connected to a node QM.

In the page buffer constructed as above, the first latch circuit unit 125 receives cache data for a cache program. A cache program employing the page buffer in accordance with an embodiment of the present invention is performed as follows.

Figure 2:
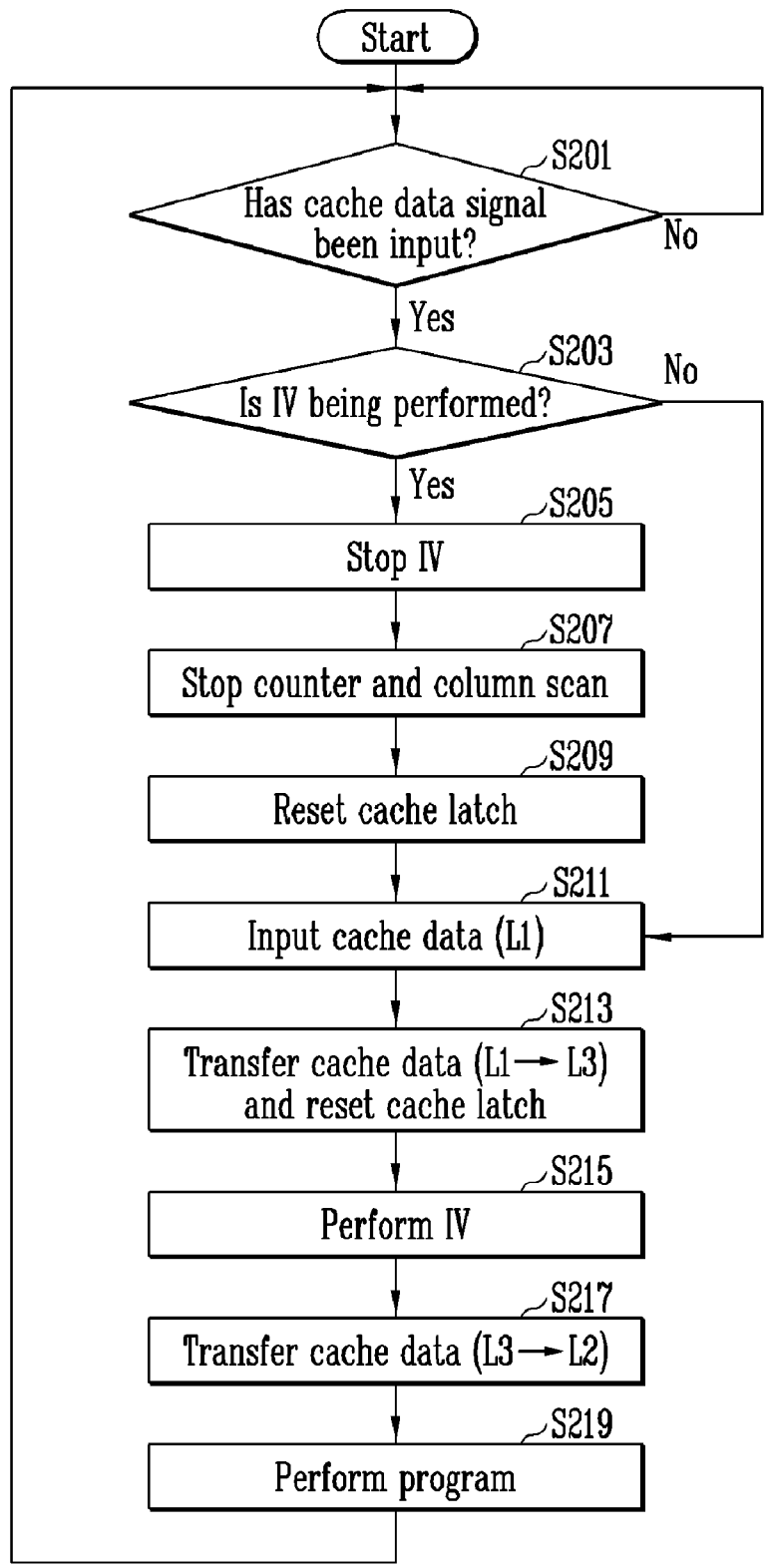
FIG. 2 is an operational flowchart showing a program method of the flash memory device in accordance with an embodiment of the present invention.

FIG. 2 is an operational flowchart showing a program method of the flash memory device in accordance with an embodiment of the present invention.

Referring to FIG. 2, while a program is being performed, if the first latch L1 (i.e., a cache latch of the page buffer 121) becomes available and a signal, indicating that next data for a cache program has been input, is received from the outside (S201), it is determined whether a program or an IV operation is currently performed (S203).

If, as a result of the determination in step S203, the IV operation is currently performed, the IV operation is stopped (S205), the operation of an address counter is stopped and reset, and column scan is then stopped (S207). Since the address counter has been stopped and reset, an IV operation must be performed again when the IV operation restarts.

The first latch L1 (i.e., a cache latch) is then reset (S209). At this time, the operations of the steps S207 and S209 has to be performed for a short time before cache data for a cache program is input.

That is, the cache data input for the cache program include a program command 80H and address information, cache program data and finally an execution command 15H.

Thus, while the program command 80H and the address information are being input, the steps S207 and S209 must be executed. The execution time of the steps S207 and S209 is generally about 200 ns. A command code, which enables the steps S207 and S209 to be performed during this short time, can be stored in the controller 160.

Meanwhile, after the first latch L1 is reset, the cache data for the cache program is input to the first latch L1. A method of inputting the cache data to the first latch L1 can be generally performed using data input means connected to the first latch L1. The data input means is a known technology and therefore is not shown in FIG. 1B for simplicity.

If the cache data is all input to the first latch L1 of the page buffers 121 of the page buffer unit 120, the data of the first latch L1 is moved to the third latch L3 (i.e., a temporary latch), and the first latch L1 is reset (S213).

After the first latch L1 is reset, an IV operation (i.e., a program verify operation) is performed (S215). Here, the IV operation performed in step S215 corresponds to the IV operation stopped in step S205. Thus, the IV operation is performed again from the beginning since the column scan has been stopped by resetting the address counter in step S207.

Meanwhile, if an IV operation is not being performed when the cache data input signal is input (S201), input cache data is directly input to the first latch L1 (S211).

The cache data input to the first latch L1 is again moved to the third latch L3, and the IV operation is performed again after the first latch L1 is reset.

After the IV operation is completed, the data stored in the third latch L3 (i.e., a temporary latch) is moved to the second latch L2 (i.e., a main latch) (S217) and a program is then performed (S219). At this time, the cache data stored in the third latch L3 is moved to the first latch L1 (i.e., a cache latch) and then moved to the second latch L2 again. Alternatively, data can be moved directly from the third latch L3 to the second latch L2 according to an implemented algorithm.

After the program is performed, the process returns to the step S201, so that a cache program command and an IV operation can be controlled not to overlap with each other.

As described above, in accordance with the program method of a nonvolatile memory device according to the present invention, although an IV operation is performed when cache data is input, data is not overlappingly input to the latch of the page buffer.

The embodiment disclosed herein has been proposed to allow a person skilled in the art to easily implement the present invention, and the person skilled in the part may implement the present invention in various ways. Therefore, the scope of the present invention is not limited by or to the embodiment as described above, and should be construed to be defined only by the appended claims and their equivalents.

What is claimed is:

1. A program method of a nonvolatile memory device, comprising:
    performing a first program operation for programming a first data stored in a first latch;
    inputting a cache program signal for inputting a second data to be programmed subsequently, during the performance of a first program operation;
    determining whether a first program verify operation is being performed, when the cache program signal is input;
    stopping the first program verify operation and inputting the second data, if it is determined that the first program verify operation is being performed; and
    restarting the first program verify operation, after the inputting of the second data.

2. The method of claim 1, wherein the inputting of the second data includes:
    storing the second data in a second latch; and
    transferring the second data stored in the second latch to a third latch and resetting the second latch.

3. The method of claim 2, further comprising refraining from restarting the first program operation while the second data is stored in the second latch, the data stored in the second latch is transferred to the third latch and the second latch is reset, and thereafter restarting the first program verify operation.

4. The method of claim 2, wherein the first program verify operation is performed through the second latch after the data stored in the first latch is transferred to the second latch.

5. The method of claim 4, further comprising resetting the second latch after the first program verify operation is stopped.

6. The method of claim 2, wherein if it is determined that the first program verify operation is not being performed when the cache program signal is input, storing the second data in the second latch, transferring the data stored in the second latch to the third latch, and resetting the second latch.

7. The method of claim 6, wherein if it is determined that the first program verify operation is not being performed when the cache program signal is input, refraining from restarting the first program operation while the second data is stored in the second latch, the data stored in the second latch is transferred to the third latch and the second latch is reset, and thereafter, restarting the first program verify operation.

8. The method of claim 6, wherein if it is determined that the first program verify operation is not being performed after the second latch is reset, performing the first program verify operation.

9. The method of claim 8, wherein after the first program verify operation is completed, the data in the third latch is transferred to the second latch, the data in the second latch is transferred to the first latch, and a second program operation is performed.

10. The method of claim 1, wherein the stopping of the first program verify operation includes resetting an address counter for the first program verify operation and stopping a column scan.

11. A program method of a nonvolatile memory device, comprising:

performing a first verify program operation for programming a first data stored in a first latch;

inputting a cache program signal for inputting a second data to be programmed subsequently, during the performance of the first program verify operation;

stopping the first program verify operation, storing the second data in a second latch, and transferring the second data stored in the second latch to a third latch according to the cache program signal;

resetting the second latch; and restarting and performing the first program verify operation.

12. The method of claim 11, wherein the stopping of the first program verify operation includes resetting an address counter for the first program verify operation and stopping a column scan.

* * * * *